US012681363B2

(12) United States Patent
Liang

(10) Patent No.: US 12,681,363 B2
(45) Date of Patent: Jul. 14, 2026

(54) ADJUSTABLE FLASH MODULE

(71) Applicant: GUANGZHOU LUXVISIONS INNOVATION TECHNOLOGY LIMITED, Guangzhou City (CN)

(72) Inventor: Kai Chih Liang, Guangzhou City (CN)

(73) Assignee: GUANGZHOU LUXVISIONS INNOVATION TECHNOLOGY LIMITED, Guangzhou City (CN)

( * ) Notice: Subject to any disclaimer, the term of this patent is extended or adjusted under 35 U.S.C. 154(b) by 0 days.

(21) Appl. No.: 19/227,435

(22) Filed: Jun. 3, 2025

(65) Prior Publication Data

US 2026/0093161 A1 Apr. 2, 2026

Related U.S. Application Data

(60) Provisional application No. 63/699,810, filed on Sep. 27, 2024.

(30) Foreign Application Priority Data

Feb. 8, 2025 (CN) .......................... 202510141569.8

(51) Int. Cl.
G03B 15/03 (2021.01)
G03B 15/05 (2021.01)
(Continued)

(52) U.S. Cl.
CPC ............. G03B 15/03 (2013.01); G03B 15/05 (2013.01); H04N 23/71 (2023.01); H04N 23/74 (2023.01); H10H 20/856 (2025.01); H10H 20/857 (2025.01); H10H 29/142 (2025.01); H10H 29/24 (2025.01); H10H

29/8514 (2025.01); H10H 29/853 (2025.01); H10W 90/00 (2026.01); G03B 2215/0592 (2013.01)

(58) Field of Classification Search
CPC ..................................................... G03B 15/03
USPC ........................................................... 362/18
See application file for complete search history.

(56) References Cited

U.S. PATENT DOCUMENTS 6,188,526 B1 * 2/2001 Sasaya ..................... G02B 1/06
359/666
6,344,930 B1 * 2/2002 Kaneko .................. G02B 30/52
359/666

(Continued)

FOREIGN PATENT DOCUMENTS

CN 110995992 4/2020
CN 113109978 7/2021

(Continued)

OTHER PUBLICATIONS

"Office Action of China Counterpart Application", issued on Aug. 30, 2025, p. 1-p. 9.

*Primary Examiner* — Bryon T Gyllstrom
(74) *Attorney, Agent, or Firm* — JCIPRNET

(57) ABSTRACT

Provided is an adjustable flash module, including a flash, a base, a deformable optical lens, and an actuator. The base includes a bottom and a sidewall located on the bottom, in which the flash is disposed on the bottom, and the sidewall surrounds the flash. The deformable optical lens is disposed on the sidewall, and located above the flash. The actuator is disposed at the edge of the deformable optical lens, and is configured to cause the deformable optical lens to generate deformation.

11 Claims, 10 Drawing Sheets

(51) Int. Cl.

| | |
|---|---|
| *H04N 23/71* | (2023.01) |
| *H04N 23/74* | (2023.01) |
| *H10H 20/856* | (2025.01) |
| *H10H 20/857* | (2025.01) |
| *H10H 29/14* | (2025.01) |
| *H10H 29/24* | (2026.01) |
| *H10H 29/851* | (2025.01) |
| *H10H 29/853* | (2025.01) |
| *H10W 90/00* | (2026.01) |

(56)            References Cited

U.S. PATENT DOCUMENTS

| | | | | |
|---|---|---|---|---|
| 6,369,954 | B1 * | 4/2002 | Berge | G02B 26/005 |
| | | | | 349/200 |
| 6,400,905 | B1 * | 6/2002 | Tenmyo | G03B 15/06 |
| | | | | 362/17 |
| 7,324,287 | B1 * | 1/2008 | Gollier | G02B 3/14 |
| | | | | 359/666 |
| 7,382,976 | B1 * | 6/2008 | Mok | H10H 20/853 |
| | | | | 257/E33.059 |
| 7,826,144 | B2 * | 11/2010 | Mescher | G02B 26/0875 |
| | | | | 359/666 |
| 8,879,160 | B2 * | 11/2014 | Bolis | G02B 26/0825 |
| | | | | 359/666 |
| 9,521,307 | B2 | 12/2016 | Jarvis et al. | |
| 9,871,955 | B2 | 1/2018 | Kim | |
| 11,346,984 | B2 * | 5/2022 | Karam | G02B 7/28 |
| 12,001,121 | B2 * | 6/2024 | Coughenour | H04N 23/74 |
| 12,393,032 | B2 * | 8/2025 | Bolis | G02B 27/0172 |
| 2011/0038625 | A1 * | 2/2011 | Zellers | G02B 7/04 |
| | | | | 396/133 |
| 2012/0170920 | A1 * | 7/2012 | Moreau | G02B 3/14 |
| | | | | 359/666 |
| 2023/0258944 | A1 * | 8/2023 | Bolis | G02B 27/0172 |
| | | | | 345/8 |

FOREIGN PATENT DOCUMENTS

| | | |
|---|---|---|
| CN | 114609772 | 6/2022 |
| TW | I665505 | 7/2019 |

* cited by examiner

ADJUSTABLE FLASH MODULE

CROSS-REFERENCE TO RELATED APPLICATION

This application claims the priority benefits of U.S. provisional application Ser. No. 63/699,810, filed on Sep. 27, 2024, and China application serial no. 202510141569.8, filed on Feb. 8, 2025. The entirety of each of the above-mentioned patent applications is hereby incorporated by reference herein and made a part of this specification.

BACKGROUND

Technical Field

The disclosure relates to a flash module, particularly relates to an adjustable flash module.

Description of Related Art

In the field of photography technology, adequate lighting helps capture clear images of objects. Therefore, a flash module is almost always present in a camera alongside an image-capturing module. As the distance between the object and the camera, as well as the field of view of the camera, changes, suitable lighting provided by the flash module is also different. For example, when shooting objects at a greater distance or with a smaller field of view, the flash module needs to provide more focused lighting to adequately illuminate distant objects, without wasting illumination energy on a large field of view. On the other hand, when shooting objects at a closer distance or with a larger field of view, the flash module needs to provide more diffused lighting with a larger field of view, so that the illumination of the object is not too bright, while also illuminating a larger field of view.

However, conventional flash modules adopt fixed illumination, which cannot correspondingly adjust illumination in response to the distance of objects or changes in the field of view.

SUMMARY

The disclosure is directed to an adjustable flash module, which may utilize a simple architecture to adjust illumination.

An embodiment of the disclosure proposes an adjustable flash module, including a flash, a base, a deformable optical lens, and an actuator. The base includes a bottom and a sidewall located on the bottom, in which the flash is disposed on the bottom, and the sidewall surrounds the flash. The deformable optical lens is disposed on the sidewall, and located above the flash. The actuator is disposed at the edge of the deformable optical lens, and is configured to cause the deformable optical lens to generate deformation.

In the adjustable flash module according to an embodiment of the disclosure, since the actuator is disposed at the edge of the deformable optical lens to cause the deformable optical lens to generate deformation, the adjustable flash module according to an embodiment of the disclosure may utilize a simple architecture to achieve the effect of adjusting illumination.

DESCRIPTION OF THE EMBODIMENTS

Figure 1A:
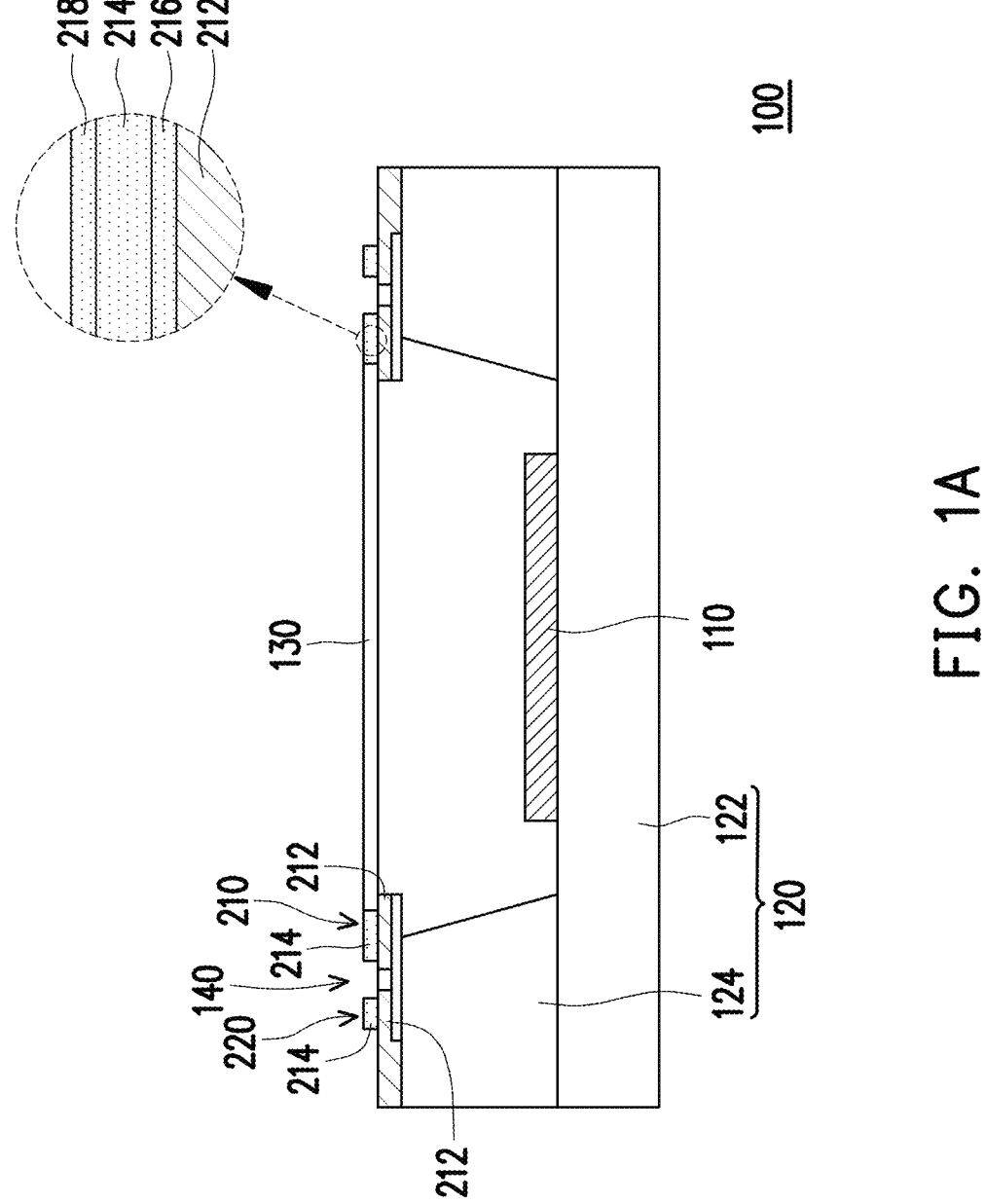
FIG. 1A is a schematic cross-sectional view of an adjustable flash module according to an embodiment of the disclosure.

Reference will now be made in detail to exemplary embodiments of the disclosure, examples of the embodiments are illustrated in the accompanying drawings. Wherever possible, the same reference numerals in the drawings and description are used to denote the same or similar parts.

Figure 1B:
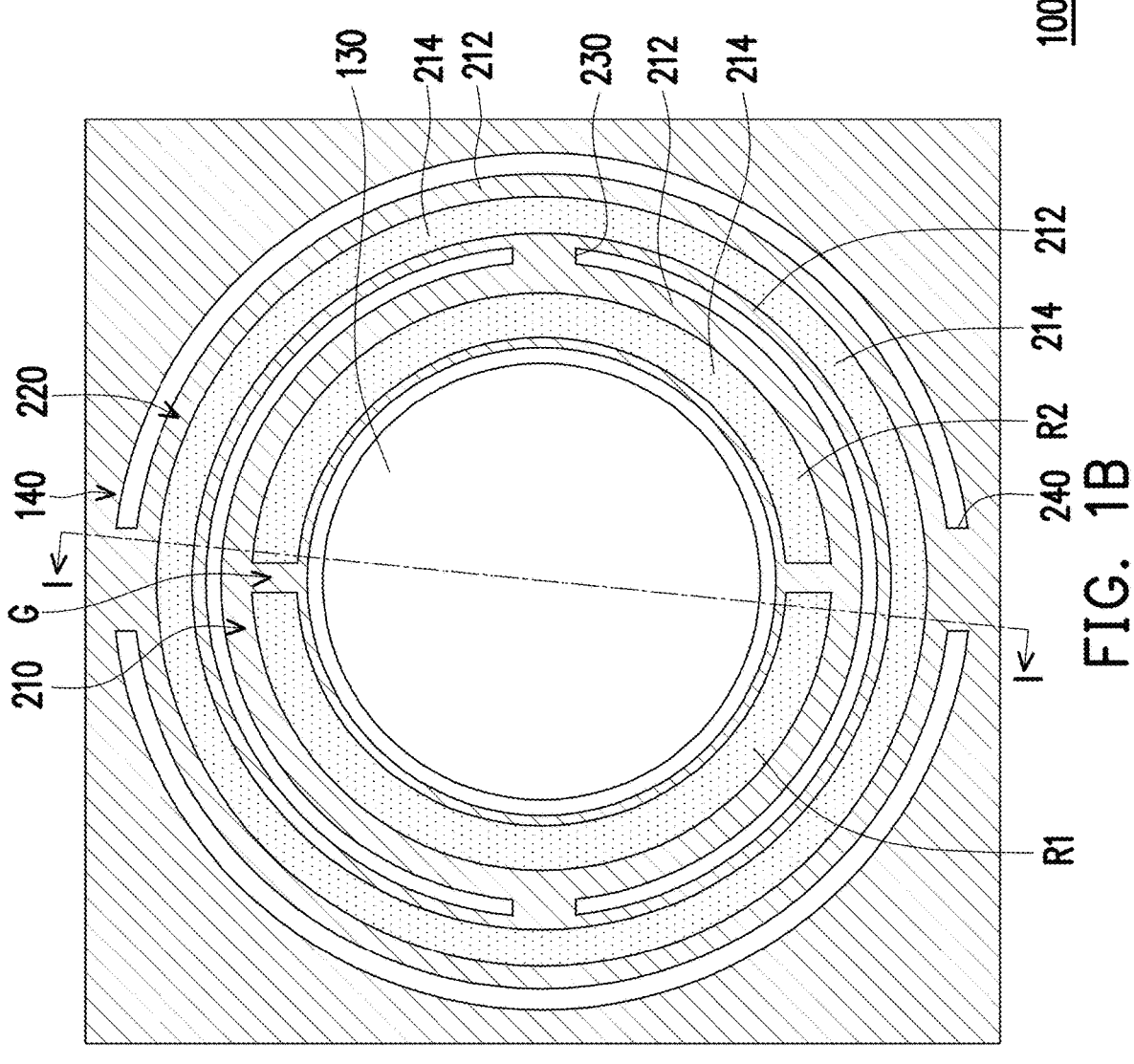
FIG. 1B is a schematic top view of the adjustable flash module in FIG. 1A.

FIG. 1A is a schematic cross-sectional view of an adjustable flash module according to an embodiment of the disclosure, and FIG. 1B is a schematic top view of the adjustable flash module in FIG. 1A, in which FIG. 1A is a schematic cross-sectional view of the adjustable flash module in FIG. 1B along a line I-I. Referring to FIG. 1A and FIG. 1B, an adjustable flash module 100 of this embodiment includes a flash 110, a base 120, a deformable optical lens 130, and an actuator 140. The base 120 includes a bottom 122 and a sidewall 124 located on the bottom, in which the flash 110 is disposed on the bottom 122, and the sidewall 124 surrounds the flash 110. The deformable optical lens 130 is disposed on the sidewall 124, and located above the flash 110. The actuator 140 is disposed at the edge of the deformable optical lens 120, and is configured to cause the deformable optical lens 130 to generate deformation. In this embodiment, the flash 110 may include a light-emitting diode or other appropriate light-emitting elements. The light emitted by the flash 110 penetrates through the deformable optical lens 130 and transmit to the outside world to provide illumination to the outside world, and the deformable optical lens 130 in different shapes may modulate the light emitted by the flash 110 into different light field distributions, thereby forming different illumination effects. In addition, in this embodiment, the deformable optical lens 130 is disposed on the sidewall 124 through the actuator 140.

Figure 2A:
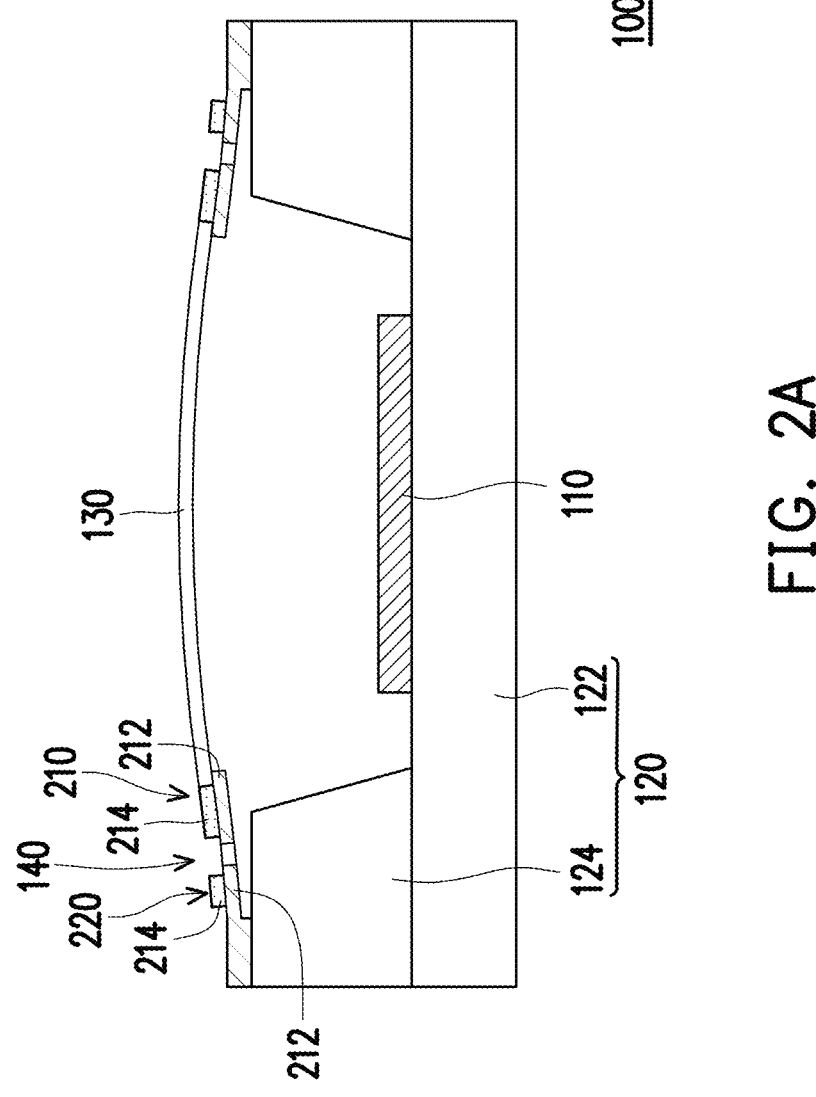
FIG. 2A and FIG. 2B are schematic cross-sectional views of the adjustable flash module in FIG. 1A when a deformable optical lens thereof generates two different deformation states.
Figure 2B:
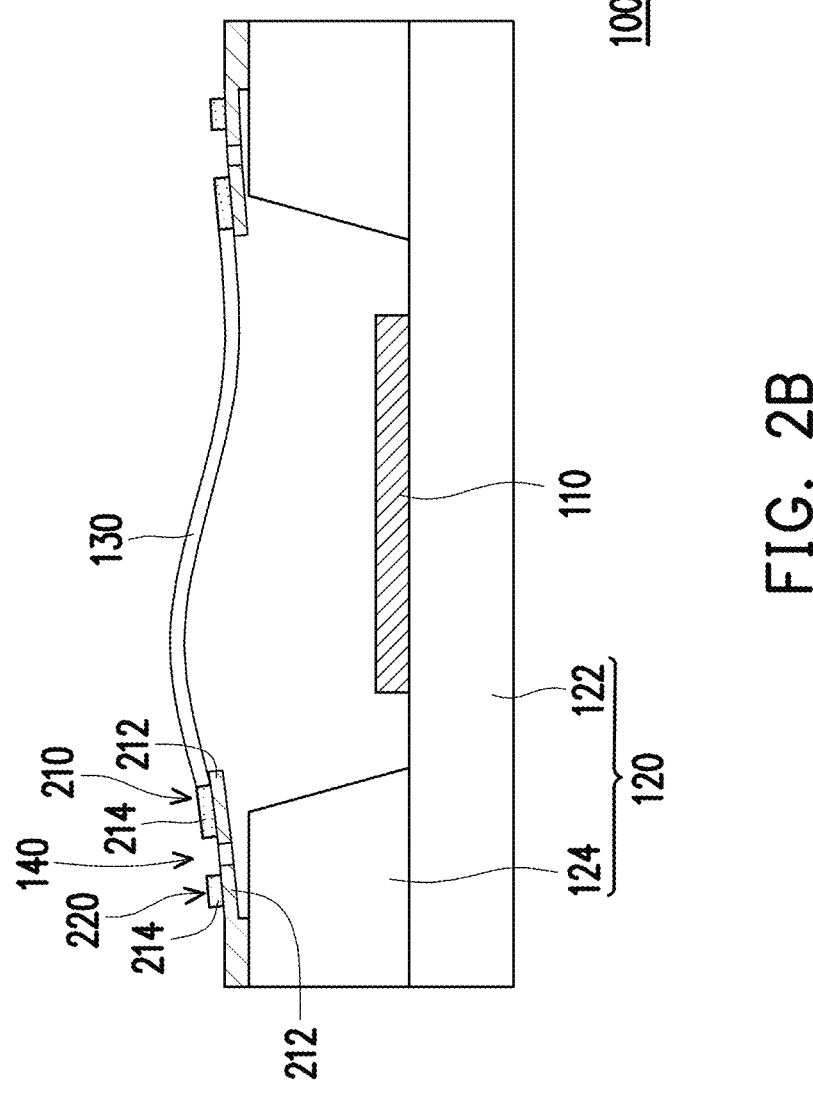
Figure 3A:
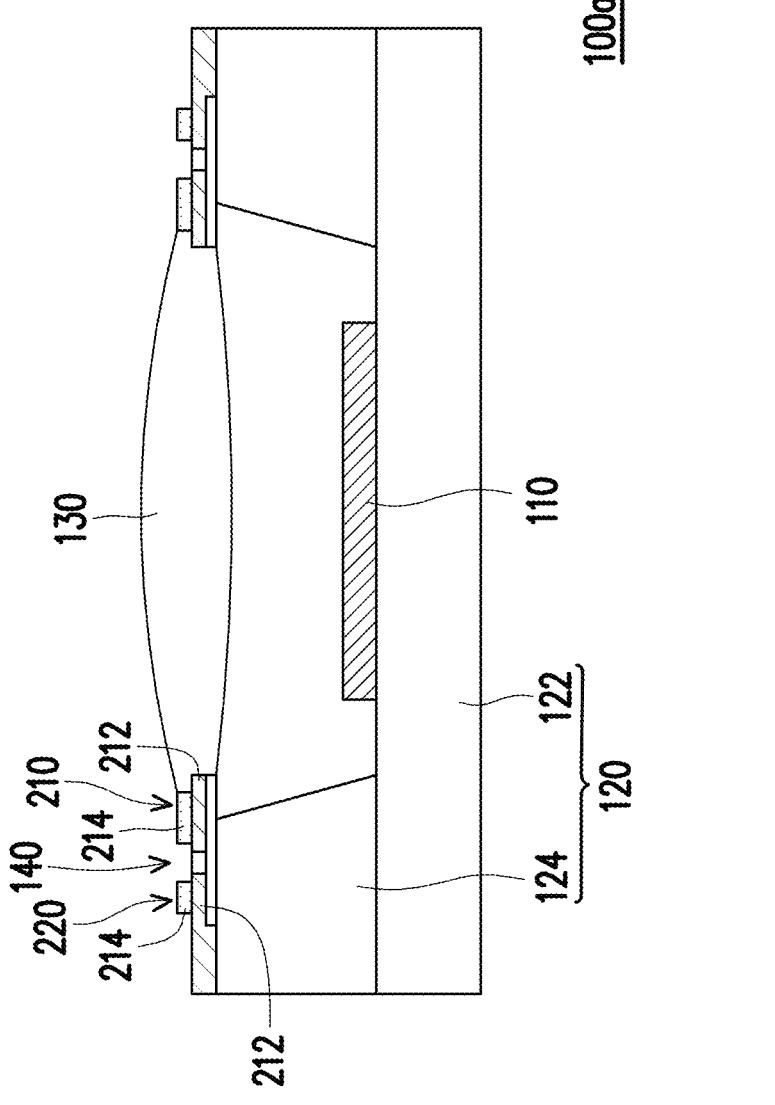
FIG. 3A to FIG. 3C are schematic cross-sectional views of the adjustable flash module according to another embodiment of the disclosure when the deformable optical lens thereof generates three different states.
Figure 3B:
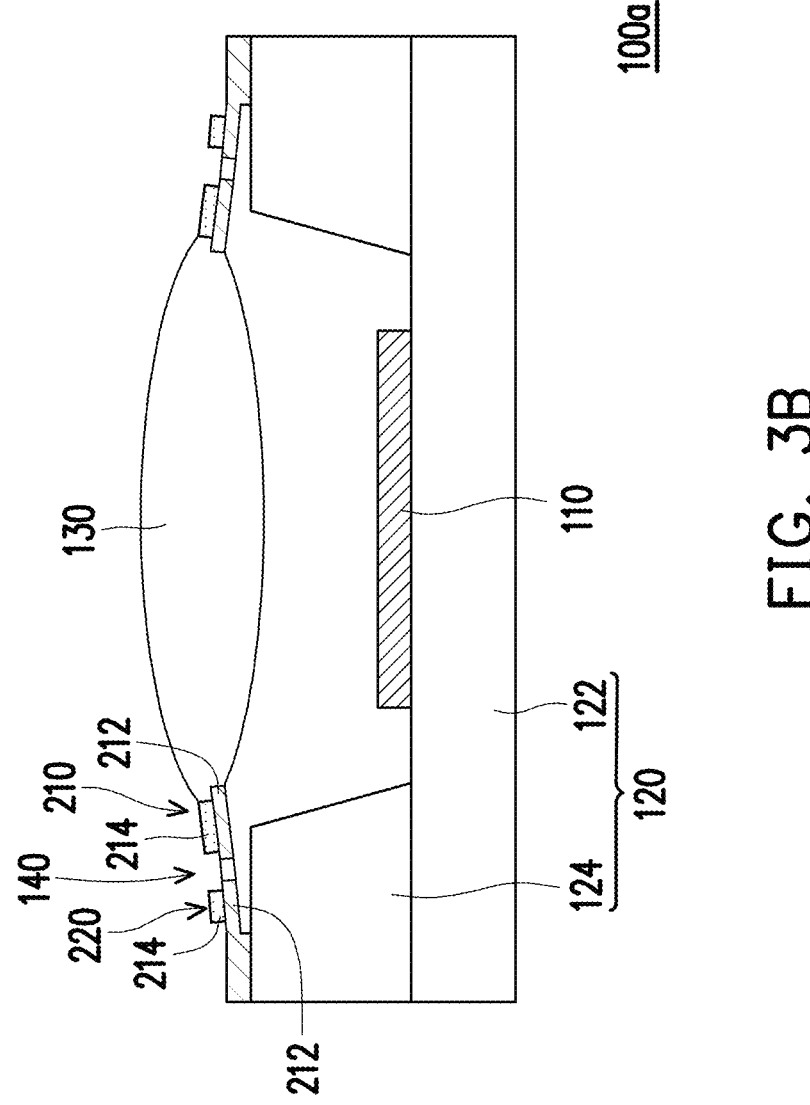
Figure 3C:
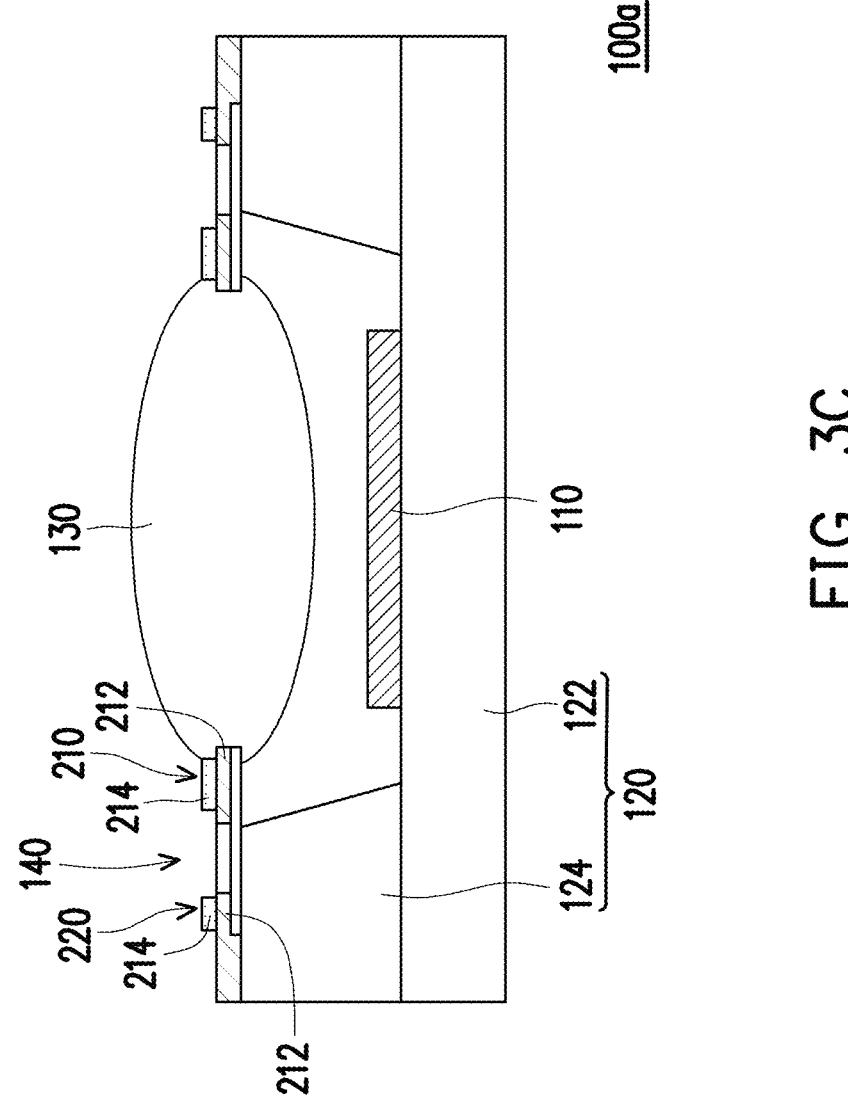

FIG. 2A and FIG. 2B are cross-sectional schematic views of the adjustable flash module in FIG. 1A when the deformable optical lens thereof generates two different deformation states, and FIG. 3A to FIG. 3C are schematic cross-sectional views of the adjustable flash module according to another embodiment of the disclosure when the deformable optical lens thereof generates three different states. Referring to FIG. 1A, FIG. 1B, FIG. 2A, FIG. 2B, and FIG. 3A to FIG. 3C, the deformable optical lens 130 may be a gel lens (as shown in FIG. 3A to FIG. 3C) or a flexible optical plate (as shown in FIG. 1A, FIG. 2A, FIG. 2B). The actuator 140 is configured to cause the deformable optical lens 130 to generate deformation in at least one degree of freedom among six degrees of freedom in space. In this embodiment, the deformation generated in the at least one degree of freedom among the six degrees of freedom includes at least one of extension/contraction (as shown in FIG. 3A and FIG. 3C), bending (as shown in FIG. 2A), and twisting (as shown in FIG. 2B).

In this embodiment, the actuator 140 includes a first ring structure 210, a second ring structure 220, a first connecting section 230, and a second connecting section 240. The first ring structure 210 is disposed around the deformable optical lens 130, and the second ring structure 220 surrounds the first ring structure 210. The first connecting section 230 connects the first ring structure 210 with the second ring structure 220, and the second connecting section 240 connects the second ring structure 220 with the sidewall 124. The first ring structure 210 and the second ring structure 220 may be closed loop structures (that is, continuous rings) or open loop structures (that is, rings with gaps or openings or discontinuous rings), and are collectively referred to as ring structures herein.

In this embodiment, each of the first ring structure 210 and the second ring structure 220 includes a bottom ring 212 and a piezoelectric material ring 214 disposed on the bottom ring 212, in which the piezoelectric material ring 214 is sandwiched between two electrodes 216 and 218 (see the partially enlarged view of FIG. 1A), and one electrode 216 (that is, the lower electrode) is disposed between the bottom ring 212 and the piezoelectric material ring 214, while the other electrode 218 (that is, the upper electrode) is disposed on the upper surface of the piezoelectric material ring 214 facing away from the bottom ring 212, in which the shape of the top view of the upper electrode (that is, electrode 218) may be consistent with the shape of the top view of the piezoelectric material ring 214.

When voltage is applied to the two electrodes 216 and 218, causing the piezoelectric material ring 214 to generate deformation, the actuator 140 causes the deformable optical lens 130 to generate extension/contraction (as shown in FIG. 3A and FIG. 3C), bending (as shown in FIG. 2A), twisting (as shown in FIG. 2B), and lifting/lowering (as shown in FIG. 3B) or combinations thereof, thereby changing the light field distribution. For example, when voltage is applied to the two electrodes 216 and 218, causing the radius of the piezoelectric material ring 214 of the first ring structure 210 to decrease, the radius of the bottom ring 212 of the first ring structure 210 decreases, thereby squeezing the edge of the deformable optical lens 130, causing the deformable optical lens 130 to generate bending as shown in FIG. 2A, rising as shown in FIG. 3B, or radius contraction with increased thickness as shown in FIG. 3C.

In this embodiment, the piezoelectric material ring 214 of the first ring structure 210 includes multiple piezoelectric material arc segments R1, R2 (in FIG. 1B, two piezoelectric material arc segments R1 and R2 are shown as an example), and the piezoelectric material arc segments R1, R2 have gaps G therebetween and are not connected. In some embodiments, the piezoelectric material arc segments may have various different quantities, be located at various different positions, and have various different sizes, and the disclosure is not limited to the two piezoelectric material arc segments R1 and R2 shown in FIG. 1B. Furthermore, in another embodiment, the piezoelectric material ring 214 of the first ring structure 210 may also be a complete continuous circular ring, like the piezoelectric material ring 214 of the second ring structure 220. In yet another embodiment, the piezoelectric material ring 214 of the second ring structure 220 includes multiple piezoelectric material arc segments (like the multiple piezoelectric material arc segments R1, R2 of the piezoelectric material ring 214 of the first ring structure 210), and the piezoelectric material arc segments have gaps therebetween (like the gaps G between the piezoelectric material arc segments R1, R2 of the first ring structure 210) and are not connected.

In the adjustable flash module 100 or 100a of this embodiment, since the actuator 140 is disposed at the edge of the deformable optical lens 130 to cause the deformable optical lens 130 to generate deformation, the adjustable flash module 100 or 100a of this embodiment may utilize a simple architecture to achieve the effect of adjusting illumination, thereby controlling the focusing distance or field of view of the illumination of the adjustable flash module 100 or 100a, to meet the illumination requirements of the camera module for shooting at different focal lengths.

Figure 4:
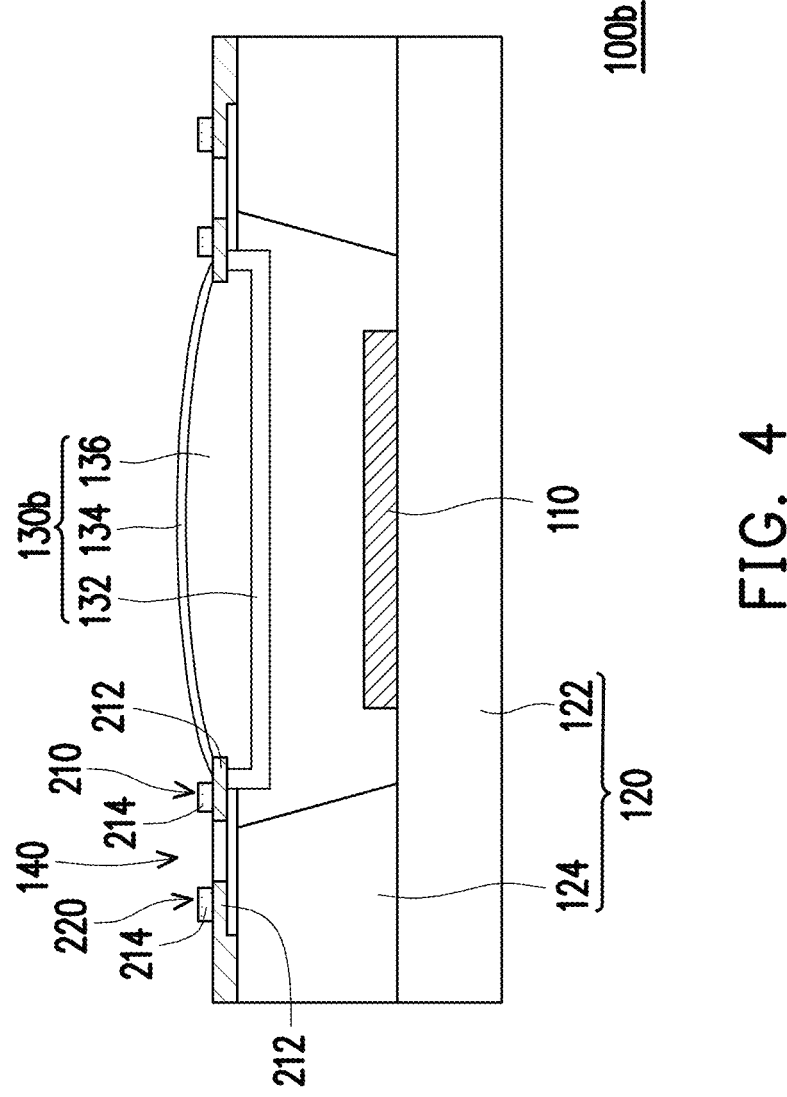
FIG. 4 is a schematic cross-sectional view of the adjustable flash module according to yet another embodiment of the disclosure.

FIG. 4 is a schematic cross-sectional view of the adjustable flash module according to yet another embodiment of the disclosure. Referring to FIG. 4, an adjustable flash module 100b of this embodiment is similar to the adjustable flash module 100 in FIG. 1A, and the main differences between the two modules are described as follows. In the adjustable flash module 100b of this embodiment, a deformable optical lens 130b includes a hard bottom cover 132, a flexible top cover 134, and a liquid lens 136, in which the liquid lens 136 is filled between the hard bottom cover 132 and the flexible top cover 134. In this way, the actuator 140 may also cause the deformable optical lens 130b to change the shape thereof.

Figure 5A:
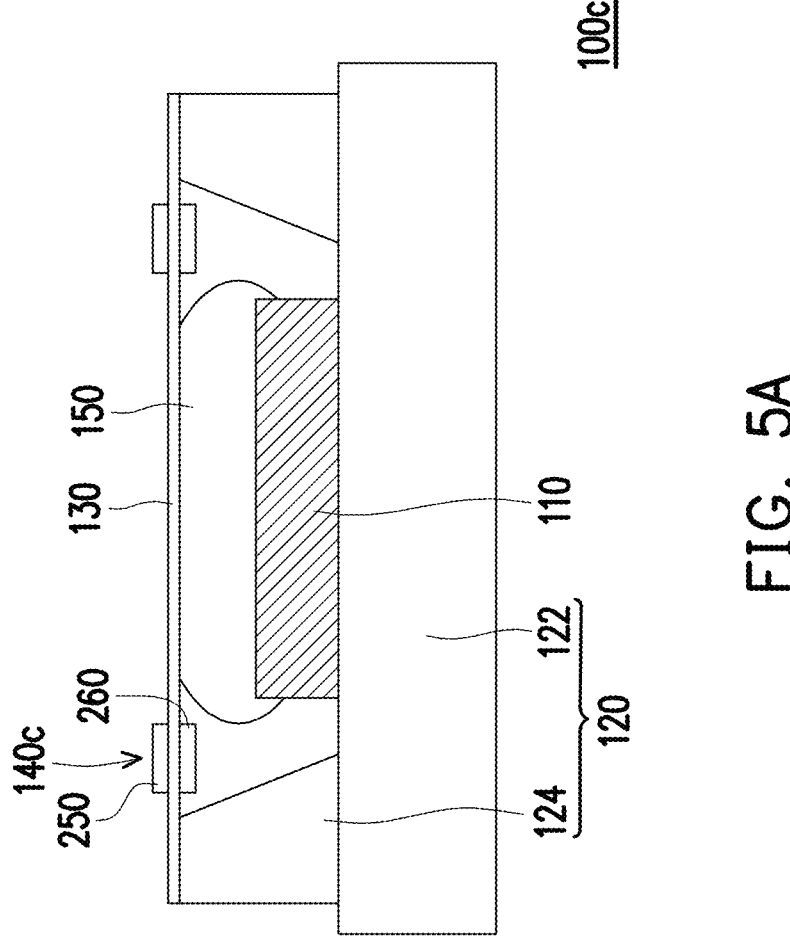
FIG. 5A and FIG. 5B are schematic cross-sectional views of the adjustable flash module according to still another embodiment of the disclosure when the deformable optical lens thereof generates two different deformation states.
Figure 5B:
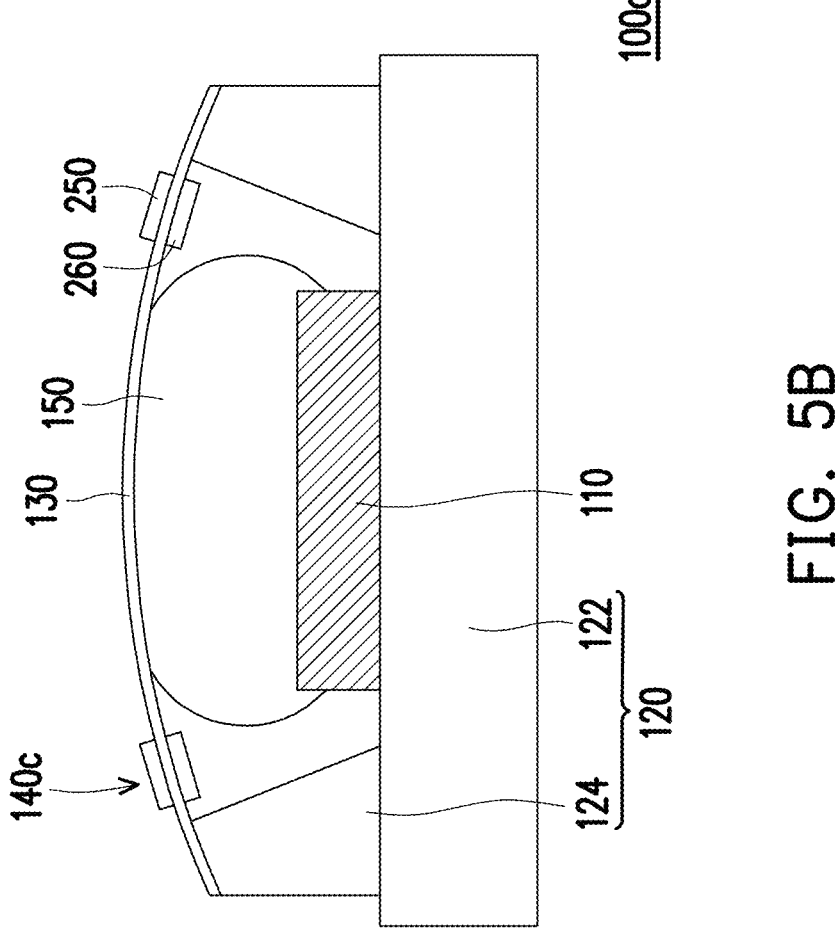

FIG. 5A and FIG. 5B are schematic cross-sectional views of the adjustable flash module according to still another embodiment of the disclosure when the deformable optical lens thereof generates two different deformation states. An adjustable flash module 100c of this embodiment is similar to the adjustable flash module 100 in FIG. 1A, and the main differences between the two modules are described as follows. In the adjustable flash module 100c of this embodiment, the actuator 140c includes a first piezoelectric material ring 250 and a second piezoelectric material ring 260 disposed on an upper side and a lower side of the edge of the deformable optical lens 130 respectively. The adjustable flash module 100c further includes an optical adhesive 150, disposed between the deformable optical lens 130 and the flash 110, and adhering the deformable optical lens 130 and the flash 110. When voltage is applied to the first piezoelectric material ring 250 and the second piezoelectric material ring 260 to deform the components, the deformable optical lens 130 may consequently bend, thereby causing the optical adhesive 150 to generate deformation. In this way, the illumination effect of the adjustable flash module 100c may also be changed, such as changing the focusing distance or field of view of the illumination of the adjustable flash module 100c.

In this embodiment, electrodes are also disposed on both the upper and lower sides of the first piezoelectric material ring 250, and electrodes are also disposed on both the upper and lower sides of the second piezoelectric material ring 260 (similar to the electrodes 216 and 218 disposed on the upper and lower sides of the piezoelectric material ring 214 in the enlarged partial view of FIG. 1A). In FIG. 5B, the first piezoelectric material ring 250 expands the radius thereof when voltage is applied by the electrodes, while the second piezoelectric material ring 260 reduces the radius thereof when voltage is applied by the electrodes, which may consequently cause the deformable optical lens 130 to bend.

In the adjustable flash module according to an embodiment of the disclosure, since the actuator is disposed at the edge of the deformable optical lens to cause the deformable optical lens to generate deformation, the adjustable flash module according to an embodiment of the disclosure may utilize a simple architecture to achieve the effect of adjusting illumination.

Finally, it should be noted that, the foregoing embodiments are merely used to explain the technical solution of the disclosure, and the embodiments are not to limit the disclosure. Although the disclosure has been described in detail with reference to the foregoing embodiments, persons of ordinary skill in the art should understand that the technical solutions recorded in the foregoing embodiments may still be modified, or equivalently replaced part or all of the technical features, and the modifications or replacements do not make the essence of the corresponding technical solutions depart from the scope of the technical solutions of the embodiments of the disclosure.

What is claimed is:

1. An adjustable flash module, comprising:
a flash;
a base comprising a bottom and a sidewall located on the bottom, wherein the flash is disposed on the bottom, and the sidewall surrounds the flash;
a deformable optical lens disposed on the sidewall, and located above the flash; and
an actuator disposed at an edge of the deformable optical lens, and configured to cause the deformable optical lens to generate deformation, wherein the actuator comprises:
a first ring structure disposed around the deformable optical lens;
a second ring structure surrounding the first ring structure;
a first connecting section connecting the first ring structure with the second ring structure; and
a second connecting section connecting the second ring structure with the sidewall, wherein a first gap exists between the first ring structure and the second ring structure, and a second gap exists between the second ring structure and the sidewall.

2. The adjustable flash module according to claim 1, wherein the actuator is configured to cause the deformable optical lens to generate deformation in at least one degree of freedom among six degrees of freedom in space.

3. The adjustable flash module according to claim 2, wherein the deformation generated in the at least one degree of freedom among the six degrees of freedom comprises at least one of extension/contraction, bending, and twisting.

4. The adjustable flash module according to claim 1, wherein each of the first ring structure and the second ring structure comprises a bottom ring and a piezoelectric material ring disposed on the bottom ring, the piezoelectric material ring is sandwiched between two electrodes, in response to voltage being applied to the two electrodes causing the piezoelectric material ring to generate deformation, the actuator causes the deformable optical lens to generate extension/contraction, bending, twisting, and lifting/lowering or combinations thereof, thereby changing a light field distribution.

5. The adjustable flash module according to claim 4, wherein the piezoelectric material ring of the first ring structure comprises a plurality of piezoelectric material arc segments, and the piezoelectric material arc segments have gaps therebetween and are not connected.

6. The adjustable flash module according to claim 4, wherein the piezoelectric material ring of the second ring structure comprises a plurality of piezoelectric material arc segments, and the piezoelectric material arc segments have gaps therebetween and are not connected.

7. The adjustable flash module according to claim 1, wherein the deformable optical lens is a gel lens or a flexible optical plate.

8. The adjustable flash module according to claim 1, wherein the deformable optical lens comprises:
a hard bottom cover;
a flexible top cover; and
a liquid lens filled between the hard bottom cover and the flexible top cover.

9. The adjustable flash module according to claim 1, wherein the deformable optical lens is disposed on the sidewall through the actuator.

10. An adjustable flash module comprising:
a flash;
a base comprising a bottom and a sidewall located on the bottom, wherein the flash is disposed on the bottom, and the sidewall surrounds the flash;
a deformable optical lens disposed on the sidewall, and located above the flash, wherein the deformable optical lens is a single-layer structure; and
an actuator disposed at an edge of the deformable optical lens, and configured to cause the deformable optical lens to generate deformation, wherein the actuator comprises a first piezoelectric material ring and a second piezoelectric material ring disposed on an upper side and a lower side of the edge of the deformable optical lens respectively.

11. The adjustable flash module according to claim 10, further comprising an optical adhesive disposed between the deformable optical lens and the flash.

* * * * *